United States Patent
Nakayama et al.

(10) Patent No.: US 8,008,631 B2
(45) Date of Patent: Aug. 30, 2011

(54) METHOD OF ACQUIRING OFFSET DEFLECTION AMOUNT FOR SHAPED BEAM AND LITHOGRAPHY APPARATUS

(75) Inventors: Takahito Nakayama, Shizuoka (JP); Kenji Ohtoshi, Kanagawa (JP); Osamu Iizuka, Kanagawa (JP); Shunji Shinkawa, Shizuoka (JP)

(73) Assignee: NuFlare Technology, Inc., Numazu-shi (JP)

( * ) Notice: Subject to any disclaimer, the term of this patent is extended or adjusted under 35 U.S.C. 154(b) by 284 days.

(21) Appl. No.: 12/495,050

(22) Filed: Jun. 30, 2009

(65) Prior Publication Data

US 2010/0001203 A1    Jan. 7, 2010

(30) Foreign Application Priority Data

Jul. 3, 2008    (JP) .................... 2008-174617

(51) Int. Cl.
  *H01J 3/26* (2006.01)
  *H01J 37/20* (2006.01)
(52) U.S. Cl. ............... 250/397; 250/396 R; 250/492.22; 250/492.2; 250/492.3; 700/121
(58) Field of Classification Search .................. 250/397, 250/396 R, 492.22, 492.2, 492.3; 700/121
  See application file for complete search history.

(56) References Cited

U.S. PATENT DOCUMENTS

| 5,124,927 | A  | * | 6/1992 | Hopewell et al. | ............. 700/121 |
| 7,679,068 | B2 | * | 3/2010 | Kamikubo et al. | ........... 250/400 |
| 2010/0175042 | A1 | * | 7/2010 | Tirapu Azpiroz et al. | ...... 716/21 |

FOREIGN PATENT DOCUMENTS

| JP | 6-124883 | 5/1994 |
| JP | 9-35057  | 2/1997 |

* cited by examiner

*Primary Examiner* — Nikita Wells
(74) *Attorney, Agent, or Firm* — Oblon, Spivak, McClelland, Maier & Neustadt, L.L.P.

(57) ABSTRACT

A method of acquiring an offset deflection amount for a shaped beam, includes forming reference images of first and second figures which can be shaped by first and second aperture plates placed on a lithography apparatus, and a reference image of a mark; forming first and second convolution reference images based on the reference images of the mark and of the first and second figures; scanning over the mark with charged particle beams shaped into the first and second figures to acquire optical images of the first and second figures; forming first and second convolution synthesis images based on the first convolution reference image and respectively the optical images of the first and second figures; and calculating an offset deflection amount for the charged particle beam shaped into the second figure to match reference positions of the first and second figures based on center-of-gravity positions of the first and second convolution synthesis images.

10 Claims, 11 Drawing Sheets

METHOD OF ACQUIRING OFFSET DEFLECTION AMOUNT FOR SHAPED BEAM AND LITHOGRAPHY APPARATUS

CROSS-REFERENCE TO RELATED APPLICATION

This application is based upon and claims the benefit of priority from prior Japanese Patent Application No. 2008-174617 filed on Jul. 3, 2008 in Japan, the entire contents of which are incorporated herein by reference.

BACKGROUND OF THE INVENTION

1. Field of the Invention

The present invention relates to a method of acquiring an offset deflection amount for a shaped beam and a lithography apparatus, for example, a method of acquiring an amount of swing-back to offset a displacement caused by a difference between shaping positions on an aperture plate in an electron beam shaped by first and second aperture plates and an apparatus therefor.

2. Related Art

A lithography technique which leads to development of miniaturizing a semiconductor device is only a very important process for exclusively generating a pattern in semiconduct or manufacturing processes. In recent years, with an increase in integration density of an LSI, a circuit line width required for a semiconductor device is getting smaller year by year. In order to form a desired circuit pattern on such a semiconductor device, a high-precision original pattern (also called a reticle or a mask) is necessary. In this case, an electron beam lithography technique essentially has an excellent resolution, and is used in production of high-precision original patterns.

FIG. 14 is a conceptual diagram for explaining an operation of a variable-shaped electron beam lithography apparatus.

The variable-shaped electron beam (EB: Electron Beam) lithography apparatus operates as described below. In a first aperture plate 410, a quadrangular, for example, rectangular opening 411 to shape an electron beam 330 is formed. In a second aperture plate 420, a variable-shaped opening 421 to shape the electron beam 330 having passed through the opening 411 of the first aperture plate 410 into a desired quadrangular shape is formed. The electron beam 330 irradiated from the charged particle source 430 and having passed through the opening 411 of the first aperture plate 410 is deflected by a deflector, passes through a part of the variable-shaped opening 421 of the second aperture plate 420, and is irradiated on a target object 340 placed on a stage continuously moving in one predetermined direction (for example, X direction). More specifically, a quadrangular shape which can pass through both the opening 411 of the first aperture plate 410 and the variable-shaped opening 421 of the second aperture plate 420 is written in a lithography region on the target object 340 placed on the stage continuously moving in the X direction (see Published Unexamined Japanese Patent Application No. 06-124883 (JP-A-06-124883), for example). The scheme for causing a beam to pass through both the opening 411 of the first aperture plate 410 and the variable-shaped opening 421 of the second aperture plate 420 to form an arbitrary shape is called a variable-shaping scheme.

In the variable-shaped lithography apparatus, as described above, positions where a beam is caused to pass through both the opening 411 of the first aperture plate 410 and the variable-shaped opening 421 of the second aperture plate 420 are changed to shape beams for writing figures of different types and different sizes. For this reason, positions where a beam is formed on the second aperture plate are different depending on figure types. For this reason, when shaped beams are deflected by the same amount of deflection with respect to all figures and irradiated on a target object, irradiation positions are misaligned by an amount of misalignment caused by a difference between positions where the beams are shaped. Therefore, an offset deflection amount (amount of swing-back deflection) must be set to each of figure types such that fixed points serving as reference positions of the figures are matched with each other.

In this case, a method for correcting misalignment is disclosed in a document (see the JP-A-06-124883, for example). The method includes: creating an optimizing template by convolution of aperture design data and a noise filter, detecting an amount of misalignment of a beam position at a peak position of a correlation function calculated by the optimizing template and a two-dimensional intensity distribution of a beam obtained by scanning the beam over a mark, and correcting the misalignment by a swing-back voltage at which the amount of misalignment is eliminated. However, because of a fine pattern and an increased in integration density of a pattern, sufficient precision cannot be easily obtained by the method. Also, a method of calculating amounts of swing-back deflection for different types of figures shaped by aperture plates is not established yet.

As described above, a method of calculating amounts of swing-back deflection for different types of figures shaped by the first and second aperture plates with high precision is not established yet.

BRIEF SUMMARY OF THE INVENTION

According to embodiments of the present invention, there is provided a method and an apparatus of acquiring amounts of swing-back for different figures shaped by first and second apertures and an apparatus used in the method.

In accordance with one aspect of the present invention, a method of acquiring an offset deflection amount for a shaped beam, includes forming reference images of first and second figures which can be shaped by first and second aperture plates placed on a lithography apparatus; forming, using design data of a mark, a reference image of the mark; forming a first convolution reference image obtained by a convolution calculation of the reference image of the mark and the reference image of the first figure and a second convolution reference image obtained by a convolution calculation of the reference image of the mark and the reference image of the second figure; respectively scanning over the mark with charged particle beams having shaped into the first and second figures by using the first and second aperture plates to acquire optical images of the first and second figures; forming a first convolution synthesis image obtained by a convolution calculation of the first convolution reference image and the optical image of the first figure and a second convolution synthesis image obtained by a convolution calculation of the second convolution reference image and the optical image of the second figure; calculating center-of-gravity positions of the first and second convolution synthesis images; and calculating an offset deflection amount for the charged particle beam having shaped into the second figure to match reference positions of the first and second figures based on the center-of-gravity positions of the first and second convolution synthesis images to output a result calculated.

In accordance with another aspect of this invention, a lithography apparatus includes an emitting unit configured to emit a charged particle beam for forming shots of charged particle beams; first and second shaping aperture plates configured to shape the charged particle beams of the shots into first and second figures; a stage configured to be arranged a mark thereon; a first forming unit configured to form reference images of the first and second figures; a second forming unit configured to form a reference image of the mark using design data of the mark; a third forming unit configured to form a first convolution reference image obtained by a convolution calculation of a reference image of the mark and the reference image of the first figure and a second convolution reference image obtained by a convolution calculation of the reference image of the mark and the reference image of the second figure; a deflector configured to respectively scan over the mark by using the charged particle beams having shaped into the first and second figures; a detector configured to detect reflected electrons from the mark; an optical image acquiring unit configured to acquire optical images of the first and second figures using output values from the detector; a fourth forming unit configured to form a first convolution synthesis image obtained by a convolution calculation of the first convolution reference image and the optical image of the first figure and a second convolution synthesis image obtained by a convolution calculation of the second convolution reference image and the optical image of the second figure; a first calculating unit configured to calculate center-of-gravity positions of the first and second convolution synthesis images; and a second calculating unit configured to calculate an offset deflection amount for the charged particle beam having shaped into the second figure to match reference positions of the first and second figures based on the center-of-gravity positions of the first and second convolution synthesis images.

DETAILED DESCRIPTION OF THE INVENTION

A configuration using an electron beam as an example of a charged particle beam will be described in the embodiments as described below. The charged particle beam is not limited to an electron beam. A beam such as an ion beam using charged particles may be used. As an example of a charged particle beam lithography apparatus, in particular, a variable-shaped electron beam lithography apparatus will be described below.

Embodiment 1

Figure 1:
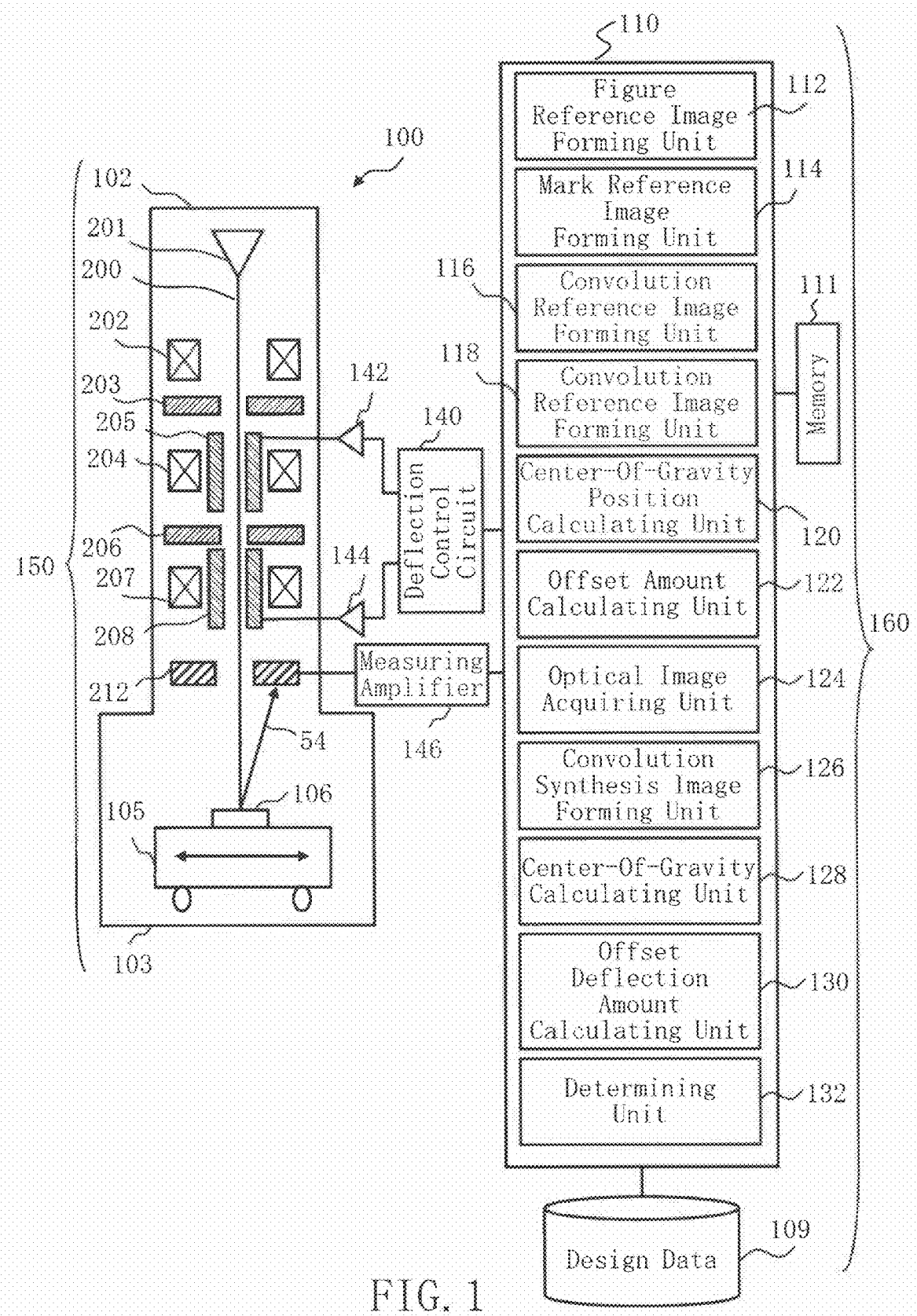
FIG. 1 is a conceptual diagram showing a configuration of a lithography apparatus according to Embodiment 1.

FIG. 1 is a conceptual diagram showing a configuration of a lithography apparatus according to Embodiment 1. In FIG. 1, a lithography apparatus 100 includes a lithography unit 150 and a control unit 160. The lithography apparatus 100 is an example of a charged particle beam lithography apparatus. The lithography apparatus 100 lithographs, or "writes" a predetermined pattern on a target object 101. The lithography unit, or "writing unit" 150 includes a lithography chamber, or "writing chamber" 103 and an electron lens barrel 102 arranged in an upper part of the lithography chamber 103. In the electron lens barrel 102, an electron gun assembly 201, an illumination lens 202, a first aperture plate 203, a projection lens 204, a deflector 205, a second aperture plate 206, an objective lens 207, a deflector 208, and a detector 212. In the lithography chamber 103, an X-Y stage 105 is arranged, and a mark 106 is arranged on the X-Y stage 105. In lithography, a target object serving as a target on which a pattern is to be lithographed is arranged on the X-Y stage 105. The target object 101 includes, for example, a mask for exposure which transfers a pattern to a wafer on which a semiconductor device is formed. This mask includes, for example, mask blanks on which any pattern is not formed. The control unit 160 includes a magnetic disk device 109, a control computer 110, a memory 111, a deflection control circuit 140, digital/analog conversion (DAC) amplifiers 142 and 144, and a measuring amplifier 146. In the control computer 110, a figure reference image forming unit 112, a mark reference image forming unit 114, convolution reference image forming units 116 and 118, a center-of-gravity position calculating unit 120, an offset amount calculating unit 122, an optical image acquiring unit 124, a convolution synthesis image forming unit 126, a center-of-gravity calculating unit 128, an offset deflection amount calculating unit 130, and a determining unit 132 are arranged. Functions of the figure reference image forming unit 112, the mark reference image forming unit 114, the convolution reference image forming units 116 and 118, the center-of-gravity position calculating unit 120, the offset amount calculating unit 122, the optical image acquiring unit 124, the convolution synthesis image forming unit 126, the center-of-gravity calculating unit 128, the offset deflection amount calculating unit 130, and the determining unit 132 may be configured to be realized by executing software on a computer such as a CPU. The functions may also be configured by hardware obtained by electric circuits. Alternatively, the functions may be realized by a combination of the hardware obtained by electric circuits and software. Alternatively, the functions may be realized by a combination of the hardware and a firmware. When the functions are realized by the software or the combination of the hardware and the software, information input to a computer which executes processing or pieces of information in calculating processing and after calculating processing are stored in the memory 111 each time the processing is performed. The magnetic disk device 109, the control computer 110, the memory 111, the deflection control circuit 140, and the measuring amplifier 146 are connected to each other by a bus (not shown). The DAC amplifiers 142 and 144 are connected to the deflection control circuit 140. In FIG. 1, only components required to explain Embodiment 1 are illustrated. The lithography apparatus 100 may generally include other necessary configurations.

When a pattern is lithographed on a target object, the following operation is performed. The electron beam 200 is emitted from the electron gun assembly 201 (emitting unit). Shots of charged particle beams are formed from the electron beam 200 emitted from the electron gun assembly 201 by a blanking system (as not shown). Each charged particle beam 200 of the shots illuminates an entire area of the first aperture plate 203 having a quadrangular, for example, square or rectangular hole with the illumination lens 202. In this case, the electron beam 200 is caused to pass through the opening of the first aperture plate 203 to shape the electron beam 200 into a quadrangular, for example, rectangular shape. The electron beam 200 of a first aperture image having passed through the first aperture plate 203 is projected on the second aperture plate 206 by the projection lens 204. A position of a first aperture image on the second aperture plate 206 is deflected by the deflector 205 to make it possible to change a beam shape and a beam size. The electron beam 200 of the second aperture image having passed through the second aperture plate 206 is focused by the objective lens 207, deflected by the deflector 208, and irradiated on a desired position of the target object 101 on the X-Y stage 105 which is movably arranged.

Figure 2:
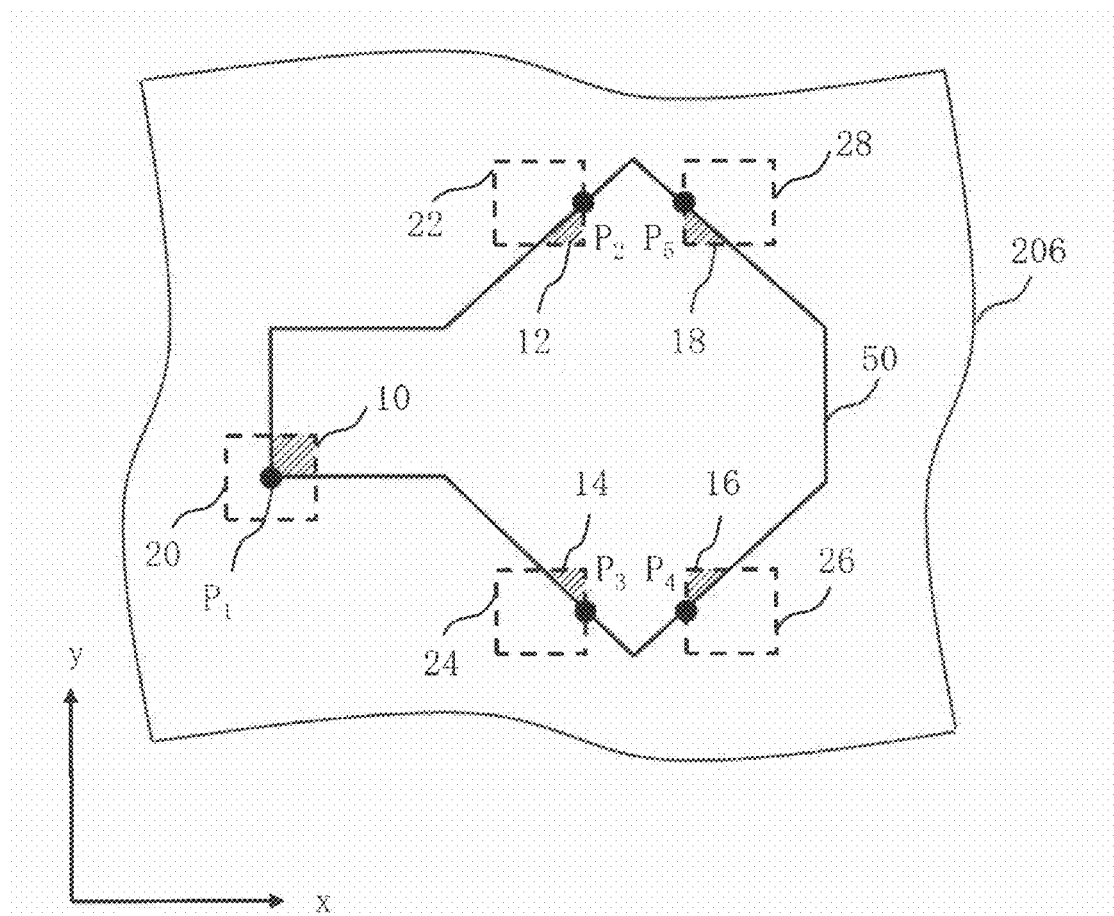
FIG. 2 is a conceptual diagram showing an example of a state in which beams are irradiated on different positions on a second aperture plate depending on a figure type into which a first aperture image is shaped according to Embodiment 1.

FIG. 2 is a conceptual diagram showing an example of a state in which beams are irradiated on different positions on a second aperture plate depending on a figure type into which a first aperture image is shaped according to Embodiment 1. In FIG. 2, in the second aperture plate 206, an opening 50 having a shape in which a hexagon constituted by two angles of 90° and four angles of 135° and a rectangle are included in such a manner that a side of the hexagon between two angles of 135° and one side of the rectangle are common. A common region between the first aperture image and the opening 50 serves as a second aperture image of the formed electron beam 200. For example, when the electron beam 200 is deflected by the deflector 205 such that a square or rectangular first aperture image 20 overlaps one of the four corners of the rectangular part of the opening 50, a quadrangular shaped beam 10 having a quadrangular shape such as a square or a rectangle including only angles of 90° is obtained. For example, when the electron beam 200 is deflected by the deflector 205 to a position a square or rectangular first image 22 crossing a side extending from a 135° angle of the hexagonal portion of the opening 50 to a 90° angle in a diagonally upper-right direction, a shaped beam 12 having a triangular shape, especially, isosceles right triangular shape having a right angle at the lower right corner is obtained. For example, when the electron beam 200 is deflected by the deflector 205 to a position a square or rectangular first aperture image 24 crossing a side extending from a 135° angle of the hexagonal portion of the opening 50 to a 90° angle in a diagonally lower-right direction, a shaped beam 14 having a triangular shape, especially, isosceles right triangular shape having a right angle at the upper right corner is obtained. For example, when the electron beam 200 is deflected by the deflector 205 to a position a square or rectangular first image 26 crossing a side extending from a 135° angle of the hexagonal portion of the opening 50 to a 90° angle in a diagonally lower-left direction, a shaped beam 16 having a triangular shape, especially, isosceles right triangular shape having a right angle at the upper left corner is obtained. For example, when the electron beam 200 is deflected by the deflector 205 to a position a square or rectangular first aperture image 28 crossing a side extending from a 135° angle of the hexagonal portion of the opening 50 to a 90° angle in a diagonally upper-left direction, a shaped beam 18 having a triangular shape, especially, isosceles right triangular shape having a right angle at the lower left corner is obtained.

When a size of the quadrangular shaped beam 10 is to be changed, a deflection position of the first aperture image 20 may be vertically and horizontally (±x and ±y directions) misaligned. At this time, a position of one angle of the four corners of the rectangular portion of the overlapped opening 50 serves as a fixed point (reference position) $P_1$ which does not change depending on the size of the shaped beam 10. When a size of the shaped beam 12 having the isosceles right triangular shape having the right angle on the lower right side is changed, a deflection position of the first aperture image 22 may be vertically (±y directions) misaligned. At this time, an intersection point position between the left side of the first aperture image 22 and a side of the opening 50 crossed by the first aperture image 22 serves as a fixed point (reference position) $P_2$ the position of which does not change depending on the size of the shaped beam 12. When a size of the shaped beam 14 having the isosceles right triangular shape having the right angle on the upper right side is changed, a deflection position of the first aperture image 24 may be vertically (±y directions) misaligned. At this time, an intersection point position between the left side of the first aperture image 24 and a side of the opening 50 crossed by the first aperture image 24 serves as a fixed point (reference position) $P_3$ the position of which does not change depending on the size of the shaped beam 14. When a size of the shaped beam 16 having the isosceles right triangular shape having the right angle on the upper left side, a deflection position of the first aperture image 26 may be vertically (±y directions) misaligned. At this time, an intersection point position between the left side of the first aperture image 26 and a side of the opening 50 crossed by the first aperture image 26 serves as a fixed point (reference position) $P_4$ the position of which does not change depending on the size of the shaped beam 16. When a size of the shaped beam 18 having the isosceles right triangular shape having the right angle on the lower left side, a deflection position of the first aperture image 28 may be vertically (±y directions) misaligned. At this time, an intersection point position between the left side of the first aperture image 28 and a side of the opening 50 crossed by the first aperture image 28 serves as a fixed point (reference position) $P_5$ the position of which does not change depending on the size of the shaped beam 18.

As described above, with respect to the shaped beam 10, the fixed point $P_1$ serves as a reference position of a quadrangle. With respect to the shaped beam 12, the fixed point $P_2$ serves as a reference position of an isosceles right triangle having a right angle on the lower right side. With respect to the shaped beam 14, the fixed point $P_3$ serves as a reference position of an isosceles right triangle having a right angle on the upper right side. With respect to the shaped beam 16, the fixed point $P_4$ serves as a reference position of an isosceles right triangle having a right angle on the upper left side. With respect to the shaped beam 18, the fixed point $P_5$ serves as a reference position of an isosceles right triangle having a right angle on the lower left side. When these shaped beams are irradiated on a target object, the shaped beams are deflected by the deflector 208 to adjust the reference positions to desired coordinates on the target object. In this case, as shown in FIG. 2, positions of the images formed on the second aperture plate 206 are changed depending on figure types. For this reason, even though shaped beams are deflected by the same amount of deflection with respect to all figures and irradiated on a target object, irradiation positions are misaligned by amounts of misalignment caused by differences of the positions where the figures are formed. For this reason, amounts of offset deflection (amounts of swing-back deflection) must be set to different figure types such that fixed points serving as reference positions of the figures are matched with each other on the target object surface.

Figure 3:
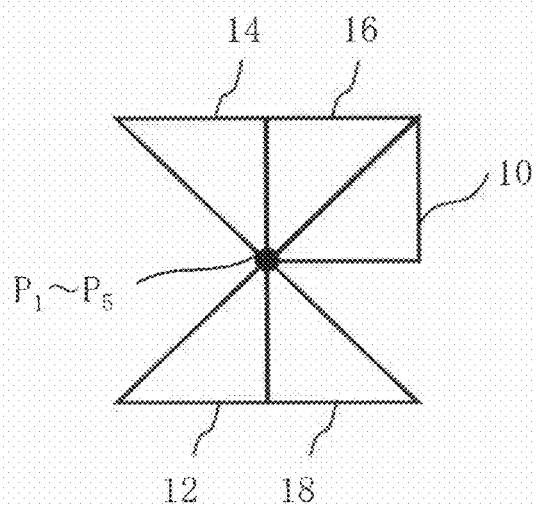
FIG. 3 is a conceptual diagram showing an example of a state in which fixed points of figures according to Embodiment 1 are matched with each other.

FIG. 3 is a conceptual diagram showing an example of a state in which fixed points of figures according to Embodiment 1 are matched with each other. As shown in FIG. 3, in order to match the fixed points $P_1$ to $P_5$ to each other, amounts of offset deflection (amounts of swing-back deflection) to compensate the fixed points $P_2$ to $P_5$ such that the fixed points $P_2$ to $P_5$ are matched with the fixed point $P_1$, which is of one figure (shaped beam 10) serving as a reference used when second aperture images (shaped beams 12 to 18) are deflected by the deflector 208, must be set in advance so as to match the fixed points $P_1$ to $P_5$ to each other. Therefore, in Embodiment 1, a method of acquiring the amounts of offset deflection is described.

Figure 4:
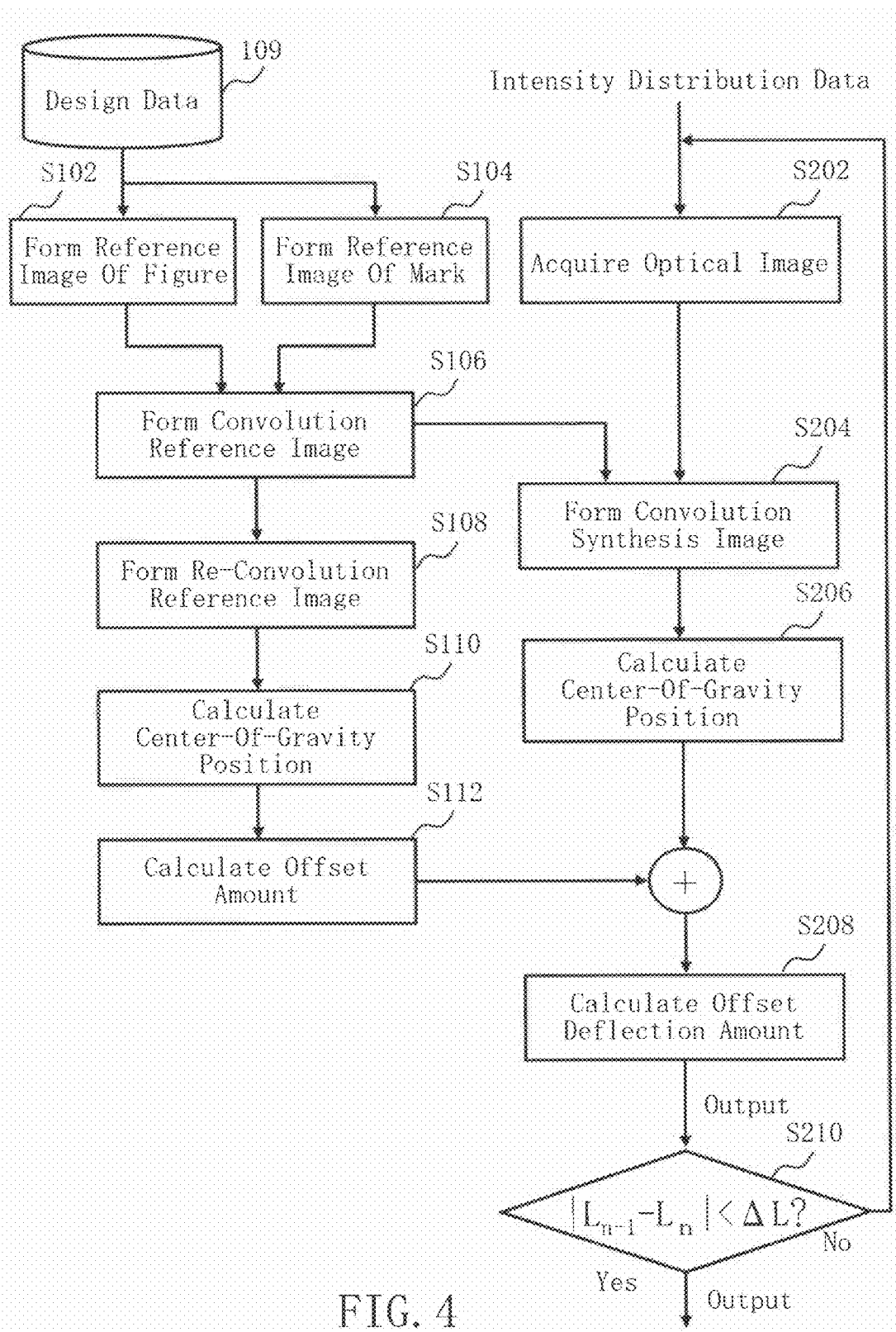
FIG. 4 is a flow chart showing main steps of a method of acquiring an offset deflection amount for a shaped beam according to Embodiment 1.

FIG. 4 is a flow chart showing main steps of a method of acquiring an offset deflection amount for a shaped beam according to Embodiment 1. In FIG. 4, in the method of acquiring an offset deflection amount for a shaped beam in Embodiment 1, steps including: a figure reference image forming step (S102), a mark reference image forming step (S104), a convolution reference image forming step (S106), a re-convolution reference image forming step (S108), a center-of-gravity position calculation step (S110), an offset amount calculation step (S112), an optical image acquiring step (S202), a convolution synthesis image forming step (S204), a center-of-gravity position calculation step (S206), an offset deflection amount calculation step (S208), and a determining step (S210) are performed.

In step (S102), as the figure reference image forming step, the figure reference image forming unit 112 forms reference images having a quadrangular shape (first figure) indicated by the shaped beam 10, an isosceles right triangular shape (second figure) having a right angle on the lower right side and indicated by the shaped beam 12, an isosceles right triangular shape (third figure) having a right angle on the upper right side and indicated by the shaped beam 14, an isosceles right triangular shape (fourth figure) having a right angle on the upper left side and indicated by the shaped beam 16, and an isosceles right triangular shape (fifth figure) having a right angle on the lower left side and indicated by the shaped beam 18. The reference images are formed based on design data of ideal figures shaped by the first aperture plate 203 and the second aperture plate 206. These design data may be stored in the magnetic disk device 109. When the figure reference image forming unit 112 forms the reference images of the figures, the design data may be read from the magnetic disk device 109.

Figures 5A, 5B, 5C, 5D, 5E:
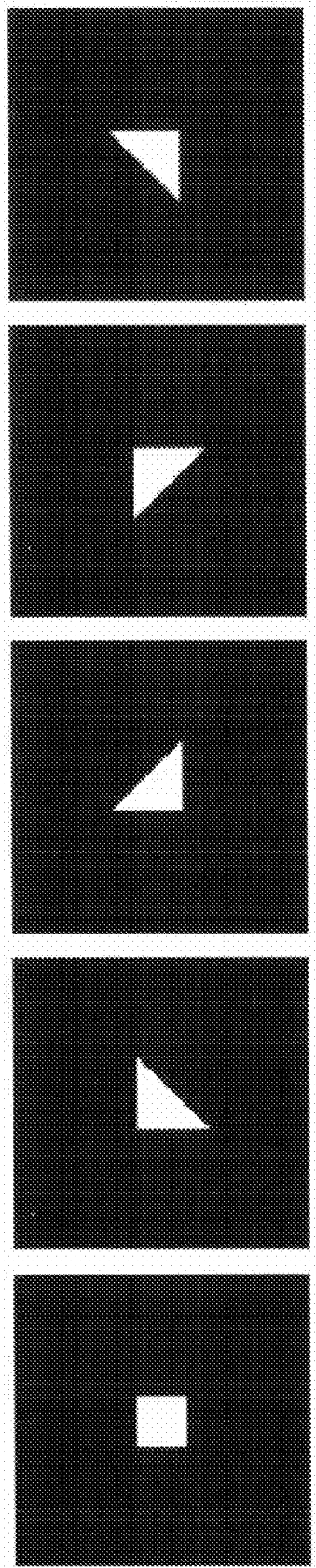
FIGS. 5A to 5E are diagrams showing examples of reference images of the figures according to Embodiment 1, respectively.

FIGS. 5A to 5E are diagrams showing examples of reference images of figures according to Embodiment 1. FIG. 5A shows an example of a reference image having a quadrangular shape indicated by the shaped beam 10. FIG. 5B shows an example of a reference image having an isosceles right triangular shape having a right angle on the upper left side and indicated by the shaped beam 16. FIG. 5C shows an example of a reference image having an isosceles right triangular shape having a right angle on the lower left side and indicated by the shaped beam 18. FIG. 5D shows an example of a reference image having an isosceles right triangular shape having a right angle on the upper right side and indicated by the shaped beam 14. FIG. 5E shows an example of a reference image having an isosceles right triangular shape having a right angle on the lower right side and indicated by the shaped beam 12. In FIGS. 5A to 5E, white portions indicate shapes of the figures, respectively.

In S104, as the mark reference image forming step, the mark reference image forming unit 114 forms a reference image of the mark 106 using design data for the mark 106.

Figure 6:
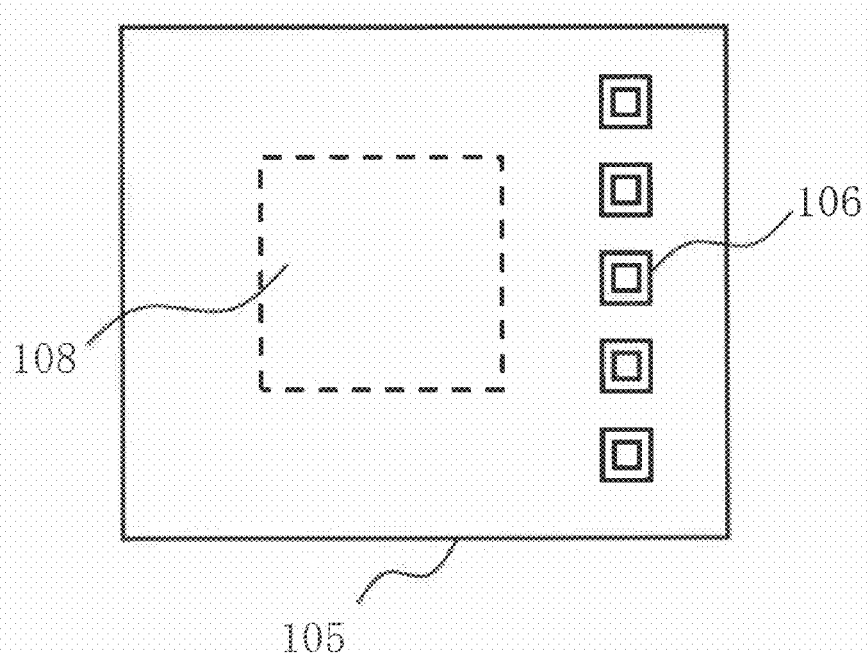
FIG. 6 is a diagram showing an example of an upper view of a stage on which a mark is arranged according to Embodiment 1.

FIG. 6 is a diagram showing an example of an upper view of a stage on which marks are arranged according to Embodiment 1. In FIG. 6, on the X-Y stage 105, a plurality of marks 106 are arranged outside a region 108 in which a target object to be lithographed is arranged. The mark 106 is formed by a material having a reflectivity different from that of Si on a silicon (Si) member (substrate). The mark 106 is preferably formed to have a square shape or a rectangular shape. As the material of the mark 106, for example, tungsten (W) or the like is preferably used. A size of the mark 106 may be larger or smaller than that of a shaped beam, or may be equal to that of the shaped beam.

Figure 7:
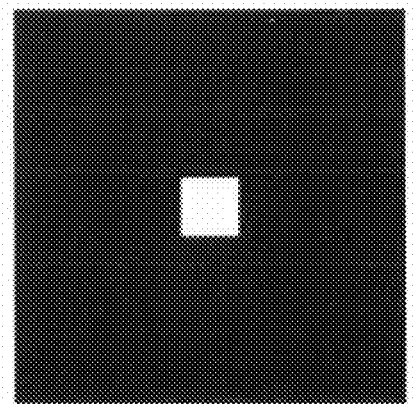
FIG. 7 is a diagram showing an example of a reference image of the mark according to Embodiment 1.

FIG. 7 is a diagram showing an example of a reference image of the mark according to Embodiment 1. The reference image of the mark 106 is formed based on design data of the mark 106 having an ideal shape. In this case, a square mark is used. The design data may be stored in the magnetic disk device 109. The design data may be read from the magnetic disk device 109 when the mark reference image forming unit 114 forms the reference image of the mark.

In S106, as the convolution reference image forming step, the convolution reference image forming unit 116 forms a quadrangular convolution reference image (first convolution reference image) indicated by the shaped beam 10. The convolution reference image is obtained by a convolution (convolution integral) calculation of the reference image of the mark and the quadrangular reference image indicated by the shaped beam 10. Similarly, the convolution reference image forming unit 116 forms a triangular convolution reference image (second convolution reference image) indicated by the shaped beam 12. The triangular convolution reference image is obtained by a convolution calculation of the reference image of the mark and the triangular reference image indicated by the shaped beam 12. Similarly, the convolution reference image forming unit 116 forms a triangular convolution reference image (third convolution reference image) indicated by the shaped beam 14. The triangular convolution reference image is obtained by a convolution calculation of the reference image of the mark and the triangular reference image indicated by the shaped beam 14. Similarly, the convolution reference image forming unit 116 forms a triangular convolution reference image (fourth convolution reference image) indicated by the shaped beam 16. The triangular convolution reference image is obtained by a convolution calculation of the reference image of the mark and the triangular reference image indicated by the shaped beam 16. Similarly, the convolution reference image forming unit 116 forms a triangular convolution reference image (fifth convolution reference image) indicated by the shaped beam 18. The triangular convolution reference image is obtained by a convolution calculation of the reference image of the mark and the triangular reference image indicated by the shaped beam 18.

Figures 8A, 8B, 8C, 8D, 8E:
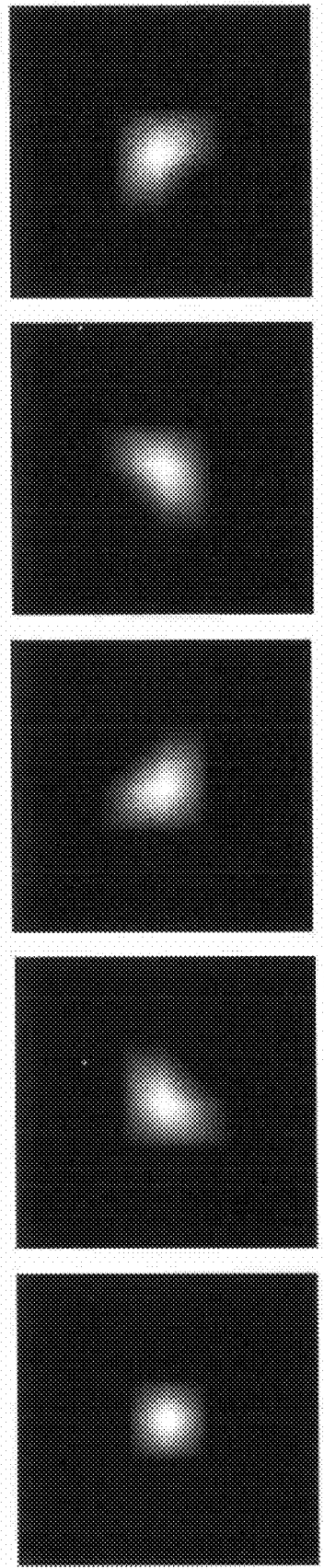
FIGS. 8A to 8E are diagrams showing examples of convolution reference images of the figures according to Embodiment 1, respectively.

FIGS. 8A to 8E are diagrams showing examples of convolution reference images of the figures according to Embodiment 1, respectively. FIG. 8A shows an example of a convolution reference image having a quadrangular shape indicated by the shaped beam 10. FIG. 8B shows an example of a convolution reference image having an isosceles right triangular shape having a right angle on the upper left side and indicated by the shaped beam 16. FIG. 8C shows an example of a convolution reference image having an isosceles right triangular shape having a right angle on the lower left side and indicated by the shaped beam 18. FIG. 8D shows an example of a convolution reference image having an isosceles right triangular shape having a right angle on the upper right side and indicated by the shaped beam 14. FIG. 8E shows an example of a convolution reference image having an isosceles right triangular shape having a right angle on the lower right side and indicated by the shaped beam 12. In FIGS. 8A to 8E, a brighter portion indicates higher degree of matching between figures. In this manner, a template image to specify a position of an optical image (will be described later) is formed.

In S108, as the re-convolution reference image forming step, the convolution reference image forming unit 118 forms a re-convolution reference image obtained by a convolution calculation of the same convolution reference images. For example, the quadrangular convolution reference images indicated by the shaped beam 10 are convoluted. Similarly, the same triangular convolution reference images indicated by the shaped beam 12 are convoluted. Similarly, the same triangular convolution reference images indicated by the shaped beam 14 are convoluted. Similarly, the same triangular convolution reference images indicated by the shaped beam 16 are convoluted. Similarly, the same triangular convolution reference images indicated by the shaped beam 18 are convoluted.

In S110, as the center-of-gravity position calculation step, the center-of-gravity position calculating unit 120 calculates a center-of-gravity position of the quadrangular convolution reference image indicated by the shaped beam 10. Similarly, the center-of-gravity position calculating unit 120 calculates a center-of-gravity position of the triangular convolution reference image indicated by the shaped beam 12. Similarly, the center-of-gravity position calculating unit 120 calculates a center-of-gravity position of the triangular convolution reference image indicated by the shaped beam 14. Similarly, the center-of-gravity position calculating unit 120 calculates a center-of-gravity position of the triangular convolution reference image indicated by the shaped beam 16. Similarly, the center-of-gravity position calculating unit 120 calculates a center-of-gravity position of the triangular convolution reference image indicated by the shaped beam 18. The center-of-gravity positions of the convolution reference images are calculated by using the re-convolution reference images formed in the previous step. The center-of-gravity positions of the convolution reference images correspond to positions which indicate maximum values of an intensity distribution of the re-convolution reference images. The center-of-gravity position calculating unit 120 calculates the maximum value of pixel value distribution of the obtained re-convolution reference images. The maximum value may be a maximum value of pixel values (gradients) of the convolution reference images. In order to more precisely calculate the maximum value, the maximum value is preferably calculated as follows.

Figure 9:
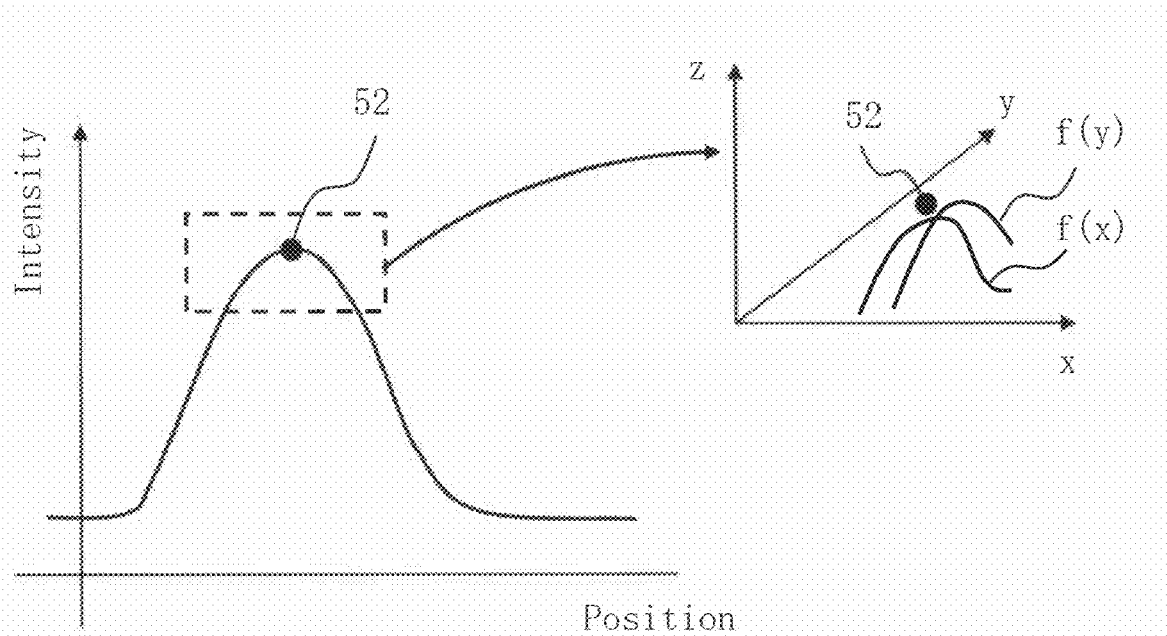
FIG. 9 is a diagram showing an example of a method of calculating a maximum value according to Embodiment 1.

FIG. 9 is a diagram showing an example of a method of calculating a maximum value according to Embodiment 1. In FIG. 9, it is assumed that a position indicating a maximum value of pixel values (gradients) of the re-convolution reference images is defined as an imaginary center-of-gravity position. For each of the re-convolution reference images, an x-direction intensity distribution is approximated (fitted) by a polynomial equation f(x), and a y-direction intensity distribution is approximated (fitted) by a polynomial equation f(y) to pass through the imaginary center-of-gravity position. Therefore, the imaginary center-of-gravity position is an intersection point of curves indicated by the two polynomial equations. However, a maximum value (peak value) of the intensity distributions on two approximation lines is not always the intersection point. Therefore, the maximum value of the intensity distribution is calculated from the peak values of the approximation lines. For example, a value of an intermediate position between the two peak positions is set to a maximum value of 52 of the intensity distribution. However, this method is not always used, and the maximum value of 52 of the intensity distribution may be calculated by another method based on the two approximation lines. The position of the maximum value obtained as described above serves as the center-of-gravity position of each of the convolution reference images.

In this case, when the convolution reference images are used as templates for obtaining a center-of-gravity position of an optical image (will be described later), the center-of-gravity positions of the convolution reference images must be matched with each other. However, center-of-gravity positions of actually obtained convolution reference images are not always matched with each other. This is because the center-of-gravity position of each of the convolution reference images has an error of almost one pixel. Therefore, for example, by using the center-of-gravity position of the quadrangular convolution reference image indicated by the shaped beam 10 as a reference image, the center-of-gravity positions of the other triangular convolution reference images are preferably offset. For this purpose, offset amounts are calculated as follows.

In S112, as the offset amount calculation step, the offset amount calculating unit 122, calculates amounts of misalignment (offset amounts) of the reference position and the center-of-gravity positions of the other triangular convolution reference images by using the center-of-gravity position of the quadrangular convolution reference image indicated by the shaped beam 10. More specifically, the offset amount calculating unit 122 calculates a misalignment of the center-of-gravity position of the quadrangular convolution reference image indicated by the shaped beam 10 and the center-of-gravity position of the triangular convolution reference image indicated by the shaped beam 12. Similarly, the offset amount calculating unit 122 calculates a misalignment of the center-of-gravity position of the quadrangular convolution reference image indicated by the shaped beam 10 and the center-of-gravity position of the triangular convolution reference image indicated by the shaped beam 14. Similarly, the offset amount calculating unit 122 calculates a misalignment of the center-of-gravity position of the quadrangular convolution reference image indicated by the shaped beam 10 and the center-of-gravity position of the triangular convolution reference image indicated by the shaped beam 16. Similarly, the offset amount calculating unit 122 calculates a misalignment of the center-of-gravity position of the quadrangular convolution reference image indicated by the shaped beam 10 and the center-of-gravity position of the triangular convolution reference image indicated by the shaped beam 18.

Figure 10:
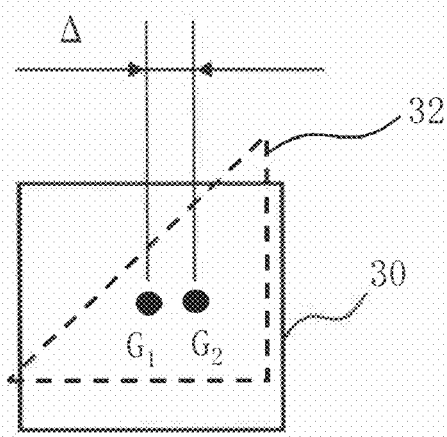
FIG. 10 is a diagram showing an example of an offset amount according to Embodiment 1.

FIG. 10 is a diagram showing an example of an offset amount according to Embodiment 1. FIG. 10 shows a case in which a misalignment of Δ occurs of a center-of-gravity position G1 of a quadrangular convolution reference image 30 indicated by the shaped beam 10 and a center-of-gravity position G2 of a triangular convolution reference image 32 indicated by the shaped beam 12. Therefore, when the triangular convolution reference image 32 indicated by the shaped beam 12 is used as a template, the misalignment of the reference image itself can be offset in consideration of only the offset amount Δ.

As described above, the convolution reference images for the figure types used as templates can be obtained. An optical image using the electron beam 200 actually shaped by the first aperture plate 203 and the second aperture plate 206 is acquired.

In S202, as the optical image acquiring step, the optical image acquiring unit 124, respectively scans over the mark 106 with the electron beams 200 having shaped into the figures to acquire optical images of the figures by using the first aperture plate 203 and the second aperture plate 206. More specifically, the optical images are acquired as follows. The electron beam 200 irradiated from the electron gun assembly 201 illuminates an entire area of the first aperture plate 203 having a quadrangular, for example, square hole by the illumination lens 202. In this case, the electron beam 200 is caused to pass through the opening of the first aperture plate 203 to shape the electron beam 200 into a quadrangle, for example, square shape. The electron beam 200 of the first aperture image 20 having passed through the first aperture plate 203 is projected on the second aperture plate 206 by the projection lens 204. A position of the first aperture image 20 on the second aperture plate 206 is deflected to a position wherein a quadrangle is shaped by the deflector 205, and the electron beam having passed through the second aperture plate 206 is shaped into a quadrangular shape indicated by the shaped beam 10. The shaped beam 10 is focused on the mark 106 by the objective lens 207 to scan over the mark 106 by the deflector 208. At this time, reflected electrons 54 reflected from the mark 106 or a portion therearound are detected by the detector 212. The detected data is converted from an analog signal into a digital signal by the measuring amplifier 146 and amplified, and then output to the control computer 110. The optical image acquiring unit 124 acquires an optical image having a quadrangular shape indicated by the shaped beam 10 by using an output value of the detector 212 obtained through the measuring amplifier 146.

Similarly, the electron beam 200 of the first aperture image 22 having passed through the first aperture plate 203 is projected on the second aperture plate 206 through the projection lens 204. A position of the first aperture image 22 on the second aperture plate 206 is deflected to a position where a triangle having a right angle on the lower right side is shaped by the deflector 205, and the electron beam having passed through the second aperture plate 206 is shaped into a triangular shape indicated by the shaped beam 12. The shaped beam 12 is focused on the mark 106 by the objective lens 207 to scan over the mark 106 by the deflector 208. At this time, the reflected electrons 54 reflected from the mark 106 or a portion therearound are detected by the detector 212. The detected data is converted from an analog signal into a digital signal by the measuring amplifier 146 and amplified, and then output to the control computer 110. The optical image acquiring unit 124 acquires a triangular optical image indicated by the shaped beam 12 by using an output value of the detector 212 obtained through the measuring amplifier 146.

Similarly, the electron beam 200 of the first aperture image 24 having passed through the first aperture plate 203 is projected on the second aperture plate 206 through the projection lens 204. A position of the first aperture image 24 on the second aperture plate 206 is deflected to a position where a triangle having a right angle on the upper right side is shaped by the deflector 205, and the electron beam having passed through the second aperture plate 206 is shaped into a triangular shape indicated by the shaped beam 14. The shaped beam 14 is focused on the mark 106 by the objective lens 207 to scan over the mark 106 by the deflector 208. At this time, the reflected electrons 54 reflected from the mark 106 or a portion therearound are detected by the detector 212. The detected data is converted from an analog signal into a digital signal by the measuring amplifier 146 and amplified, and then output to the control computer 110. The optical image acquiring unit 124 acquires a triangular optical image indicated by the shaped beam 14 by using an output value of the detector 212 obtained through the measuring amplifier 146.

Similarly, the electron beam 200 of the first aperture image 26 having passed through the first aperture plate 203 is projected on the second aperture plate 206 through the projection lens 204. A position of the first aperture image 26 on the second aperture plate 206 is deflected to a position where a triangle having a right angle on the upper left side is shaped by the deflector 205, and the electron beam having passed through the second aperture plate 206 is shaped into a triangular shape indicated by the shaped beam 16. The shaped beam 16 is focused on the mark 106 by the objective lens 207 to scan over the mark 106 by the deflector 208. At this time, the reflected electrons 54 reflected from the mark 106 or a portion therearound are detected by the detector 212. The detected data is converted from an analog signal into a digital signal by the measuring amplifier 146 and amplified, and then output to the control computer 110. The optical image acquiring unit 124 acquires a triangular optical image indicated by the shaped beam 16 by using an output value of the detector 212 obtained through the measuring amplifier 146.

Similarly, the electron beam 200 of the first aperture image 28 having passed through the first aperture plate 203 is projected on the second aperture plate 206 through the projection lens 204. A position of the first aperture image 28 on the second aperture plate 206 is deflected to a position where a triangle having a right angle on the lower left side is shaped by the deflector 205, and the electron beam having passed through the second aperture plate 206 is shaped into a triangular shape indicated by the shaped beam 18. The shaped beam 18 is focused on the mark 106 by the objective lens 207 to scan over the mark 106 by the deflector 208. At this time, the reflected electrons 54 reflected from the mark 106 or a portion therearound are detected by the detector 212. The detected data is converted from an analog signal into a digital signal by the measuring amplifier 146 and amplified, and then output to the control computer 110. The optical image acquiring unit 124 acquires a triangular optical image indicated by the shaped beam 18 by using an output value of the detector 212 obtained through the measuring amplifier 146.

When the figures described above are shaped, the sizes of the figures are matched with the sizes of the corresponding reference images described above, respectively, as a matter of course.

Figure 11:
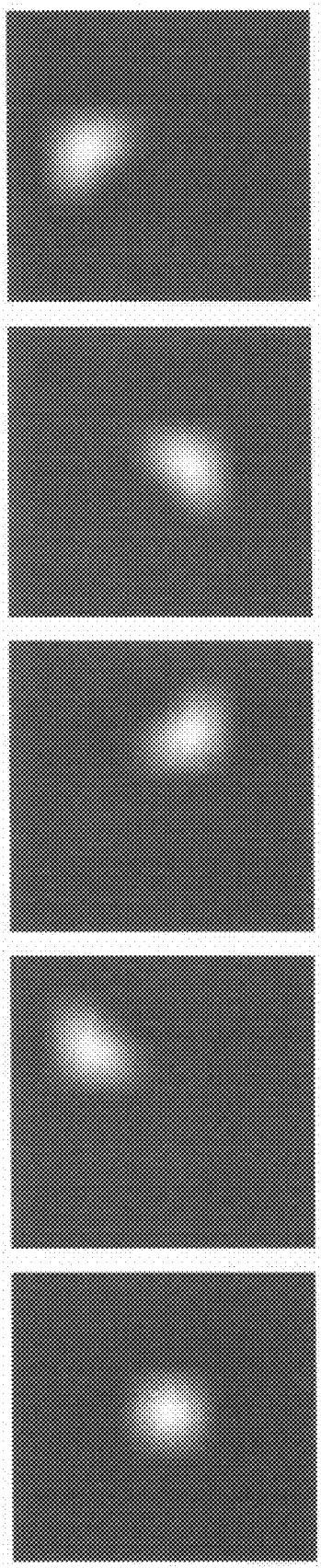
FIGS. 11A to 11E are diagrams showing examples of optical images of the figures according to Embodiment 1, respectively.

FIGS. 11A to 11E are diagrams showing examples of the optical images of the figures according to Embodiment 1, respectively. FIG. 11A shows an example of an optical image having a quadrangular shape indicated by the shaped beam 10. FIG. 11B shows an example of an optical image having an isosceles right triangular shape having a right angle on the upper left side and indicated by the shaped beam 16. FIG. 11C shows an example of an optical image having an isosceles right triangular shape having a right angle on the lower left side and indicated by the shaped beam 18. FIG. 11D shows an example of an optical image having an isosceles right triangular shape having a right angle on the upper right side and indicated by the shaped beam 14. FIG. 11E shows an example of an optical image having an isosceles right triangular shape having a right angle on the lower right side and indicated by the shaped beam 12.

In S204, as the convolution synthesis image forming step, the convolution synthesis image forming unit 126 performs convolution integral (convolution) of pixel values of the convolution reference images and pixel values of the optical images for each of figure types. Based on the obtained values, a synthesis image (convolution synthesis image) is formed. More specifically, the synthesis image is formed as follows. The convolution synthesis image forming unit 126 forms a quadrangular convolution synthesis image (first convolution synthesis image) indicated by the shaped beam 10. The convolution synthesis image is obtained by a convolution calculation of the convolution reference image having a quadrangular shape indicated by the shaped beam 10 and the optical image having a quadrangular shape indicated by the shaped beam 10. Similarly, the convolution synthesis image forming unit 126 forms a triangular convolution synthesis image (second convolution synthesis image) indicated by the shaped beam 12. The convolution synthesis image is obtained by a convolution calculation of the convolution reference image having a triangular shape indicated by the shaped beam 12 and the optical image having a triangular shape indicated by the shaped beam 12. Similarly, the convolution synthesis image forming unit 126 forms a triangular convolution synthesis image (third convolution synthesis image) indicated by the shaped beam 14 and obtained by a convolution calculation of the convolution reference image having a triangular shape indicated by the shaped beam 14 and the optical image having a triangular shape indicated by the shaped beam 14. Similarly, the convolution synthesis image forming unit 126 forms a triangular convolution synthesis image (fourth convolution synthesis image) indicated by the shaped beam 16. The convolution synthesis image is obtained by a convolution calculation of the convolution reference image having a triangular shape indicated by the shaped beam 16 and the optical image having a triangular shape indicated by the shaped beam 16. Similarly, the convolution synthesis image forming unit 126 forms a triangular convolution synthesis image (fifth convolution synthesis image) indicated by the shaped beam 18. The convolution synthesis image is obtained by a convolution calculation of the convolution reference image having a triangular shape indicated by the shaped beam 18 and the optical image having a triangular shape indicated by the shaped beam 18.

Figure 12:
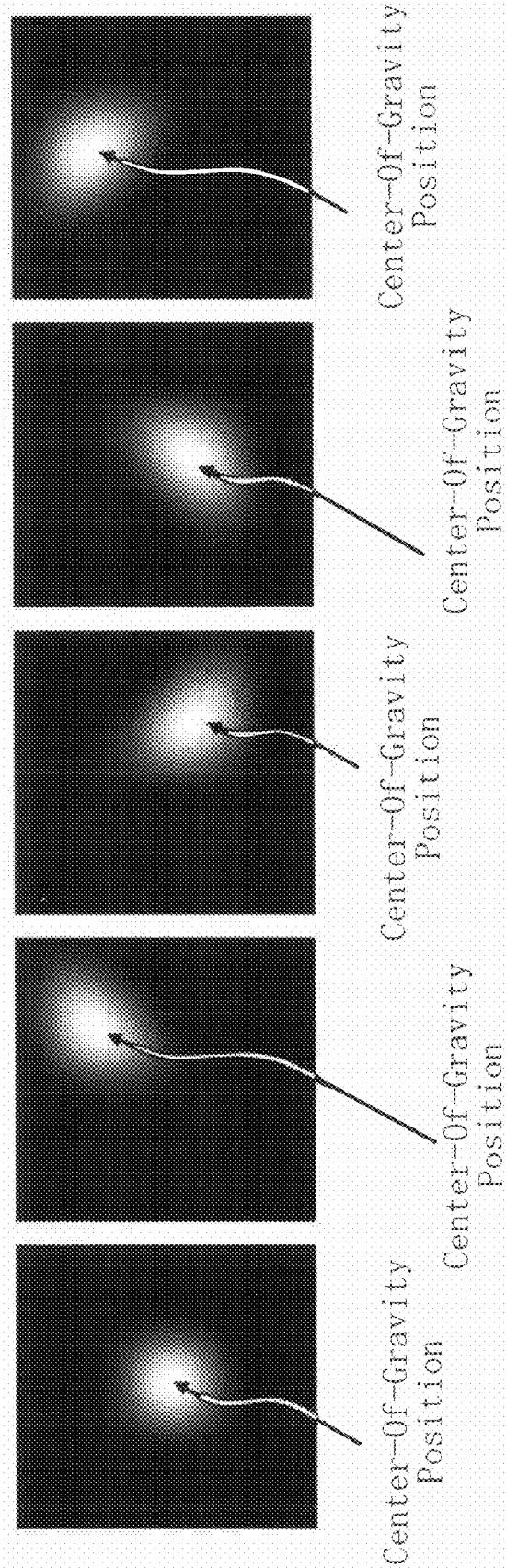
FIGS. 12A to 12E are diagrams showing examples of convolution synthesis images of the figures according to Embodiment 1, respectively.

FIGS. 12A to 12E are diagrams showing examples of convolution synthesis images of the figures according to Embodiment 1, respectively. FIG. 12A shows an example of a convolution synthesis image having a quadrangular shape indicated by the shaped beam 10. FIG. 12B shows an example of a convolution synthesis image having an isosceles right triangular shape having a right angle on the upper left side and indicated by the shaped beam 16. FIG. 12C shows an example of a convolution synthesis image having an isosceles right triangular shape having a right angle on the lower left side and indicated by the shaped beam 18. FIG. 12D shows an example of a convolution synthesis image having an isosceles right triangular shape having a right angle on the upper right side and indicated by the shaped beam 14. FIG. 12E shows an example of a convolution synthesis image having an isosceles right triangular shape having a right angle on the lower right side and indicated by the shaped beam 12.

In S206, as the center-of-gravity position calculation step, the center-of-gravity calculating unit 128 calculates a center-of-gravity position of the convolution synthesis image having a quadrangular shape indicated by the shaped beam 10. Similarly, the center-of-gravity calculating unit 128 calculates a convolution synthesis image having a triangular shape indicated by the shaped beam 12. Similarly, the center-of-gravity calculating unit 128 calculates a convolution synthesis image having a triangular shape indicated by the shaped beam 14. Similarly, the center-of-gravity calculating unit 128 calculates a convolution synthesis image having a triangular shape indicated by the shaped beam 16. Similarly, the center-of-gravity calculating unit 128 calculates a convolution synthesis image having a triangular shape indicated by the shaped beam 18. The center-of-gravity positions of the convolution synthesis images correspond to positions which indicate a maximum value of an intensity distribution of the convolution synthesis images. Therefore, a maximum value of pixel values (gradients) of the obtained convolution synthesis image is calculated. The maximum value may be a maximum value of the pixel values of the convolution synthesis image. Furthermore, in order to precisely calculate the maximum value, the maximum value may be calculated by the same method as that shown in FIG. 9. More specifically, it is assumed that a position indicating the maximum value of the pixel values (gradients) of the convolution synthesis images is defined as an imaginary center-of-gravity position. For each of the convolution synthesis images, an x-direction intensity distribution is approximated (fitted) by a polynomial equation f(x), and a y-direction intensity distribution is approximated (fitted) by a polynomial equation f(y) to pass through the imaginary center-of-gravity position. Therefore, the imaginary center-of-gravity position is an intersection point of curves indicated by the two polynomial equations. However, a maximum value (peak value) of the intensity distributions on two approximation lines is not always the intersection point. Therefore, the maximum value of the intensity distribution is calculated from the peak values of the approximation lines. For example, a value of an intermediate position between the two peak positions is set to a maximum value of 52 of the intensity distribution. However, this method is not always used, and the maximum value of the intensity distribution may be calculated by another method based on the two approximation lines. The position of the maximum value obtained as described above serves as the center-of-gravity position of each of the convolution reference images. This center-of-gravity position is a position where the reference image is maximally matched with the optical image in each of the figures.

In S208, as the offset deflection amount calculation step, the offset deflection amount calculating unit 130, calculates an amount of deflection (offset deflection amount) when electron beams having shaped into the other figures are deflected to the fixed point of the quadrangular shape indicated by the shaped beam 10 such that the fixed points (reference positions) of the figures are matched with each other based on the center-of-gravity position of the convolution synthesis image having a quadrangular shape indicated by the shaped beam 10 and the center-of-gravity positions of the convolution synthesis images having other figures. More specifically, the offset deflection amount calculating unit 130, based on the center-of-gravity position of the convolution synthesis image having a quadrangular shape indicated by the shaped beam 10 and the center-of-gravity position of the convolution synthesis image having a triangular shape indicated by the shaped beam 12, calculates an offset deflection amount of the electron beam 200 having shaped into the triangular shape indicated by the shaped beam 12 such that the fixed point of the quadrangular shape indicated by the shaped beam 10 and the fixed point of the triangular shape indicated by the shaped beam 12 are matched with each other. Similarly, the offset deflection amount calculating unit 130, calculates an offset deflection amount of the electron beam 200 having shaped into the triangular shape indicated by the shaped beam 14 such that the fixed point of the quadrangular shape indicated by the shaped beam 10 and the fixed point of the triangular shape indicated by the shaped beam 14 are matched with each other based on the center-of-gravity position of the convolution synthesis image having the quadrangular shape indicated by the shaped beam 10 and the center-of-gravity position of the convolution synthesis image having a triangular shape indicated by the shaped beam 14. Similarly, the offset deflection amount calculating unit 130, calculates an offset deflection amount of the electron beam 200 having shaped into the triangular shape indicated by the shaped beam 16 such that the fixed point of the quadrangular shape indicated by the shaped beam 10 and the fixed point of the triangular shape indicated by the shaped beam 16 are matched with each other based on the center-of-gravity position of the convolution synthesis image having the quadrangular shape indicated by the shaped beam 10 and the center-of-gravity position of the convolution synthesis image having a triangular shape indicated by the shaped beam 16. Similarly, the offset deflection amount calculating unit 130, calculates an offset deflection amount of the electron beam 200 having shaped into the triangular shape indicated by the shaped beam 18 such that the fixed point of the quadrangular shape indicated by the shaped beam 10 and the fixed point of the triangular shape indicated by the shaped beam 18 are matched with each other based on the center-of-gravity position of the convolution synthesis image having the quadrangular shape indicated by the shaped beam 10 and the center-of-gravity position of the convolution synthesis image having a triangular shape indicated by the shaped beam 18.

Figure 13:
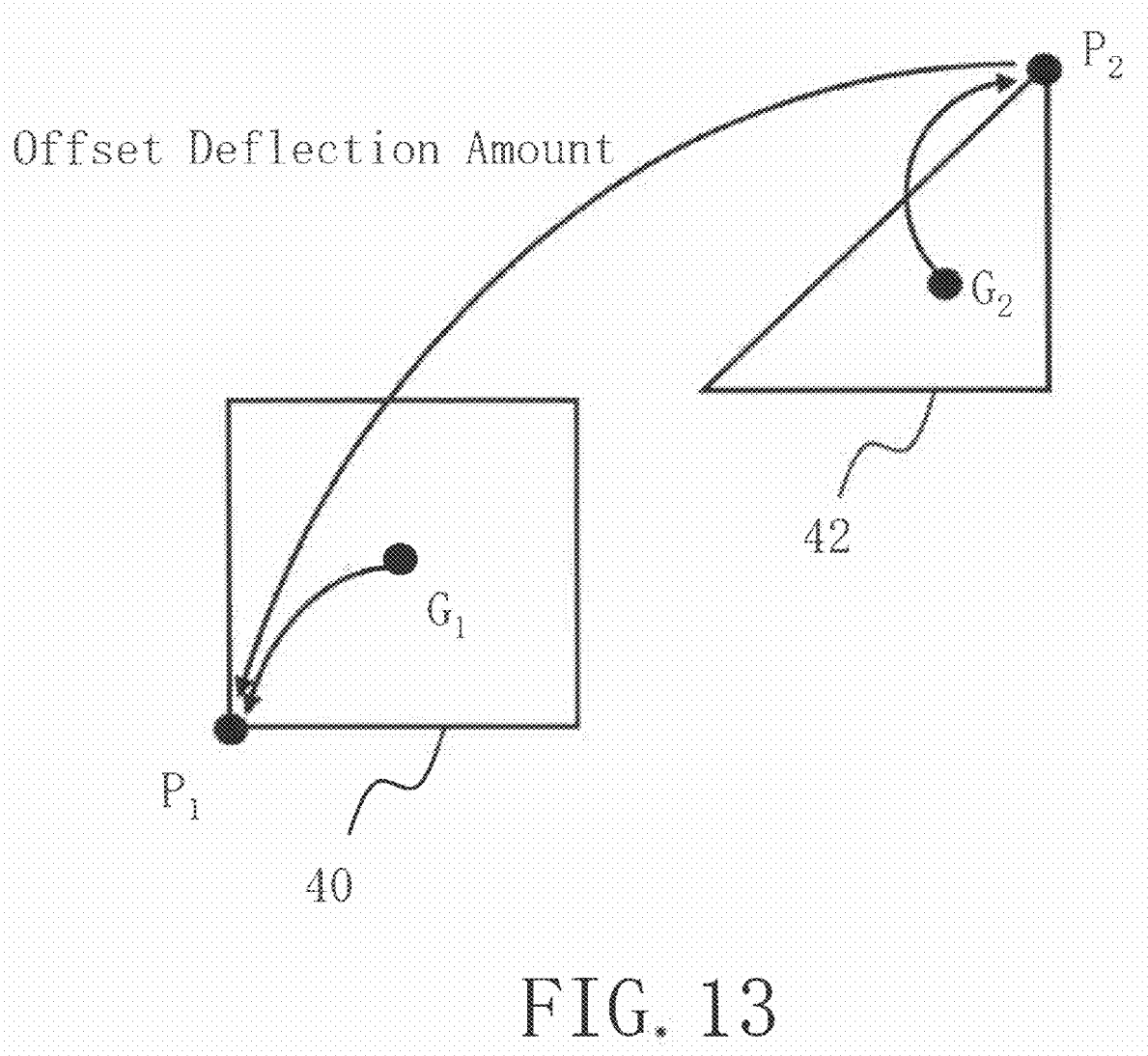
FIG. 13 is a conceptual diagram for explaining a method of calculating an offset deflection amount according to Embodiment 1.
Figure 14:
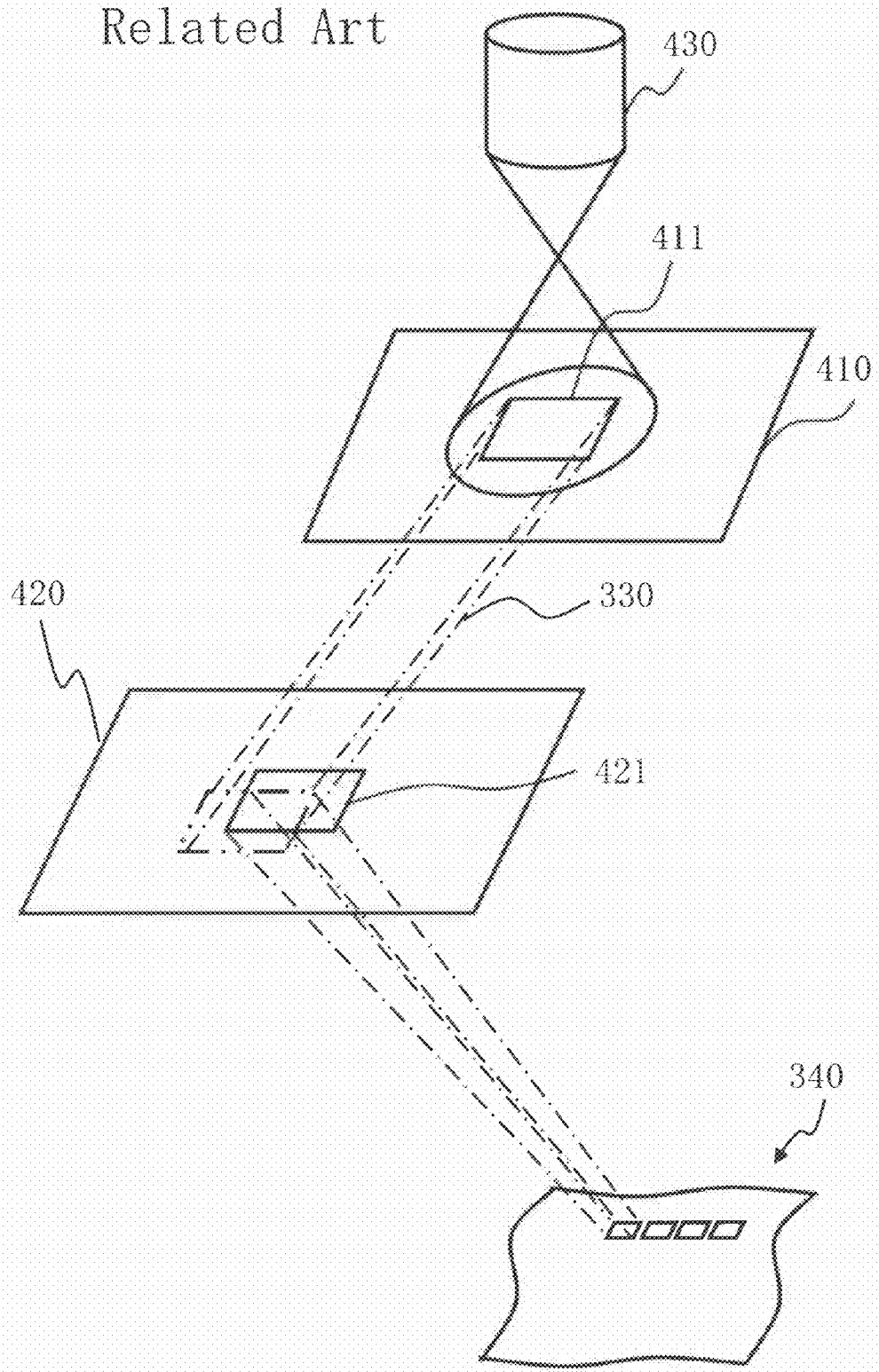
FIG. 14 is a conceptual diagram for explaining an operation of a variable-shaped electron beam lithography apparatus.

FIG. 13 is a conceptual diagram for explaining a method of calculating an offset deflection amount according to Embodiment 1. FIG. 13 shows, for example, a case in which the center-of-gravity position G1 of the convolution synthesis image serving as a reference and having a quadrangular shape indicated by the shaped beam 10 and the center-of-gravity position G2 of the convolution synthesis image having a triangular shape indicated by the shaped beam 12 are obtained. If the center-of-gravity position G1 is known, a size of a quadrangle shape 40 serving as a reference image of the center-of-gravity position G1 is known. For this reason, a position of the fixed point $P_1$ of the quadrangle shape 40 can be calculated. Similarly, if the center-of-gravity position G2 is known, a size of a triangular shape 42 serving as a reference image of the center-of-gravity position G2 is known. For this reason, a position of the fixed point $P_2$ of the triangular shape 42 can be calculated. As a result, an offset deflection amount to deflect the position of the fixed point $P_2$ to a position of the fixed point $P_1$ serving as a reference. The amounts of offset deflection may be calculated in an x direction and a y direction.

When the offset deflection amount of each of the figures is to be calculated, in order to compensate a misalignment of a reference image itself, compensation is performed by increasing or decreasing the offset amount Δ calculated in advance in the offset amount calculation step (S112). In this manner, precise amounts of offset deflection of the figures can be calculated. The amounts of offset deflection of the figures obtained as results are output. The amounts of offset deflections are stored in the memory 111 first. In order to obtain more precise amounts of offset deflection, a repeated calculation or the like is more desirably performed as follows.

In S210, as the determining step, the determining unit 132 determines, for each of the figure types, whether an absolute value of a difference between a previously obtained offset deflection amount Ln−1 and an offset deflection amount Ln obtained at the present is smaller than a threshold value ΔL. The threshold value ΔL may be changed depending on the figure types, or a common value may be used as the threshold value ΔL. When the absolute value of the difference is not smaller than the threshold value ΔL, the optical image acquiring step (S202), the convolution synthesis image forming step (S204), the center-of-gravity position calculation step (S206), the offset deflection amount calculation step (S208), and the determining step (S210) are repeated until the absolute value of the difference is smaller than the threshold value ΔL. In this repetition, when an optical image of a corresponding figure in the optical image acquiring step (S202) at the present is acquired, the deflector 208 may perform deflection by the offset deflection amount Ln−1 previously calculated to scan over the mark 106. In this manner, the offset deflection amount can be converged to a predetermined value. Even though the offset deflection amount is not a predetermined value, the repeated calculation for the obtained offset deflection amount Ln may be ended when the absolute value of the difference is smaller than an allowable threshold value ΔL. More specifically, when the absolute value of the difference is smaller than the threshold value ΔL, the offset deflection amount Ln obtained as a result is output. First, the offset deflection amount Ln is stored in the memory 111. The offset deflection amount Ln is set in the deflection control circuit 140.

With the above configuration, precise offset deflection amounts (amounts of swing-back deflection) of different figures shaped by the first aperture plate 203 and the second aperture plate 206 can be acquired.

The embodiment is described with reference to the concrete examples. However, the present invention is not limited to the concrete examples. In the above examples, fixed points of the other figures are matched to a fixed point of a reference figure. However, offset deflection amounts (amounts of swing-back deflection) may be calculated to match fixed points of all figures to an arbitrary point.

Parts of the apparatus configuration, the control method, and the like which are not directly required for the explanation of the present invention are not described. However, a necessary apparatus configuration and a necessary control method can be appropriately selected and used. For example, a control unit configuration which controls the lithography apparatus 100 is not described. However, a necessary control unit configuration is appropriately selected and used, as a matter of course.

In addition, elements of the present invention and all methods of acquiring offset deflection amounts of shaped beams and all lithography apparatuses which can be appropriately changed in design by a person skilled in the art are included in the scope of the invention.

Additional advantages and modification will readily occur to those skilled in the art. Therefore, the invention in its broader aspects is not limited to the specific details and representative embodiments shown and described herein. Accordingly, various modifications may be made without departing from the spirit or scope of the general invention concept as defined by the appended claims and their equivalents.

What is claimed is:

1. A method of acquiring an offset deflection amount for a shaped beam, comprising:
    forming reference images of first and second figures which can be shaped by first and second aperture plates placed on a lithography apparatus;
    forming, using design data of a mark, a reference image of the mark;
    forming a first convolution reference image obtained by a convolution calculation of the reference image of the mark and the reference image of the first figure and a second convolution reference image obtained by a convolution calculation of the reference image of the mark and the reference image of the second figure;
    respectively scanning over the mark with charged particle beams having shaped into the first and second figures by using the first and second aperture plates to acquire optical images of the first and second figures;
    forming a first convolution synthesis image obtained by a convolution calculation of the first convolution reference image and the optical image of the first figure and a second convolution synthesis image obtained by a convolution calculation of the second convolution reference image and the optical image of the second figure;
    calculating center-of-gravity positions of the first and second convolution synthesis images; and
    calculating an offset deflection amount for the charged particle beam having shaped into the second figure to match reference positions of the first and second figures based on the center-of-gravity positions of the first and second convolution synthesis images to output a result calculated.

2. The method according to claim 1, wherein a quadrangular shape is used as the first figure, and a right triangular shape is used as the second figure.

3. The method according to claim 2, wherein as the right triangular shape, an isosceles triangular right shape is used.

4. The method according to claim 1, further comprising:
    calculating center-of-gravity positions of the first and second convolution reference images; and
    calculating an amount of misalignment of the center-of-gravity position of the first convolution reference image and the center-of-gravity position of the second convolution reference image, wherein
    when the offset deflection amount is calculated, a difference between the center-of-gravity positions of the first and second convolution synthesis image is corrected by the amount of misalignment.

5. The method according to claim 1, wherein
    the acquiring optical images of the first and second figures, the forming the first and second convolution synthesis images, the calculating center-of-gravity positions of the first and second convolution synthesis images, and the calculating the offset deflection amount are repeated, and
    when an optical image of the second figure is acquired for a next time, a charged particle beam having shaped into the second figure is deflected by a previously calculated offset deflection amount to scan over the mark.

6. A lithography apparatus comprising:
    an emitting unit configured to emit a charged particle beam for forming shots of charged particle beams;
    first and second shaping aperture plates configured to shape the charged particle beams of the shots into first and second figures;
    a stage configured to be arranged a mark thereon;
    a first forming unit configured to form reference images of the first and second figures;
    a second forming unit configured to form a reference image of the mark using design data of the mark;
    a third forming unit configured to form a first convolution reference image obtained by a convolution calculation of a reference image of the mark and the reference image of the first figure and a second convolution reference image obtained by a convolution calculation of the reference image of the mark and the reference image of the second figure;
    a deflector configured to respectively scan over the mark by using the charged particle beams having shaped into the first and second figures;
    a detector configured to detect reflected electrons from the mark;
    an optical image acquiring unit configured to acquire optical images of the first and second figures using output values from the detector;
    a fourth forming unit configured to form a first convolution synthesis image obtained by a convolution calculation of the first convolution reference image and the optical image of the first figure and a second convolution synthesis image obtained by a convolution calculation of the second convolution reference image and the optical image of the second figure;
    a first calculating unit configured to calculate center-of-gravity positions of the first and second convolution synthesis images; and
    a second calculating unit configured to calculate an offset deflection amount for the charged particle beam having shaped into the second figure to match reference positions of the first and second figures based on the center-of-gravity positions of the first and second convolution synthesis images.

7. The apparatus according to claim 6, wherein a quadrangular shape is used as the first figure, and a right triangular shape is used as the second figure.

8. The apparatus according to claim 7, wherein as the right triangular shape, an isosceles right triangular shape is used.

9. The apparatus according to claim 6, further comprising:
    a third calculation configured to calculate center-of-gravity positions of the first and second convolution reference images; and
    a fourth calculating unit configured to calculate an amount of misalignment of the center-of-gravity position of the first convolution reference image and the center-of-gravity position of the second convolution reference image, wherein
    when the offset deflection amount is calculated, the second calculating unit corrects a difference between the center-of-gravity positions of the first and second convolution synthesis images by the amount of misalignment.

10. The apparatus according to claim 6, wherein
    the acquisition of optical images of the first and second figures, the formation of the first and second convolution synthesis images, the calculation of center-of-gravity positions of the first and second convolution synthesis images, and the calculation of the offset deflection amount are repeated, and
    when an optical image of the second figure is acquired for a next time, the deflector deflects a charged particle beam having shaped into the second figure by a previously calculated offset deflection amount to scan over the mark.

* * * * *